(12) United States Patent
Sawada

(10) Patent No.: US 7,952,578 B2
(45) Date of Patent: May 31, 2011

(54) SUPPORT APPARATUS, DESIGN SUPPORT PROGRAM, AND DESIGN SUPPORT METHOD

(75) Inventor: Yoshihiro Sawada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/641,902

(22) Filed: Dec. 18, 2009

(65) Prior Publication Data
US 2010/0097376 A1 Apr. 22, 2010

Related U.S. Application Data

(63) Continuation of application No. PCT/JP2007/063085, filed on Jun. 29, 2007.

(51) Int. Cl.
G06T 15/00 (2006.01)
(52) U.S. Cl. ........ 345/420; 345/419; 345/423; 345/428; 703/2; 382/285
(58) Field of Classification Search ............ 345/419, 345/420, 423, 428; 703/2; 382/285
See application file for complete search history.

(56) References Cited

U.S. PATENT DOCUMENTS

| | | | |
|---|---|---|---|
| 5,621,865 A | | 4/1997 | Iwamoto et al. |
| 5,712,965 A | | 1/1998 | Fujita et al. |
| 6,259,453 B1 * | | 7/2001 | Itoh et al. ........... 345/423 |
| 6,285,973 B1 | | 9/2001 | Nishino et al. |
| 7,228,519 B2 | | 6/2007 | Aoki et al. |
| 2001/0039487 A1 * | | 11/2001 | Hammersley et al. ...... 703/2 |
| 2002/0140435 A1 * | | 10/2002 | Nishino et al. ........... 324/627 |
| 2002/0191863 A1 * | | 12/2002 | Biermann et al. ......... 382/285 |
| 2007/0124720 A1 | | 5/2007 | Aoki et al. |

FOREIGN PATENT DOCUMENTS

| | | |
|---|---|---|
| JP | 6-215074 | 8/1994 |
| JP | 8-16826 | 1/1996 |
| JP | 8-166975 | 6/1996 |
| JP | 8-329134 | 12/1996 |
| JP | 11-161690 | 6/1999 |
| JP | 2004-94674 | 3/2004 |
| JP | 2004-206262 | 7/2004 |

OTHER PUBLICATIONS

Form PCT/ISA/210, mailed Oct. 2, 2007, in corresponding International Application No. PCT/JP2007/063085 (3 pages).
Form PCT/ISA/220, mailed Oct. 2, 2007, in corresponding International Application No. PCT/JP2007/063085 (4 pages).
Form PCT/ISA/237, mailed Oct. 2, 2007, in corresponding International Application No. PCT/JP2007/063085 (3 pages).

* cited by examiner

Primary Examiner — Phu Nguyen
(74) Attorney, Agent, or Firm — Staas & Halsey LLP

(57) ABSTRACT

A design support apparatus includes: a section that sets, as a reference plane in a virtual space, the plane of a mesh which is selected as a first mesh, from among meshes forming the shape of an object model displayed in the virtual space; a section that sets a vertex of the first mesh as a reference point; a section that sets a side of the first mesh that includes the reference point as a first axis and sets a axis other than the first axis that is included in the reference plane and passes the reference point as a second axis to set the first and second axes as coordinate axes; a section that sets the dimension of each coordinate axis; and a section that displays, in addition to the object model, the coordinate axes and the dimensions as a coordinate system of the reference plane.

20 Claims, 16 Drawing Sheets

SIDE MESH SELECTED AND DESIGNATED USING MOUSE

CONFIGURATION OF QUADRANGLE MESH

CONSTITUENT POINT A1   CONSTITUENT POINT A4

CONSTITUENT POINT A2   CONSTITUENT POINT A3

EXAMPLE OF SKETCH PLANE

○ : GRID COORDINATE
● : SPACE COORDINATE CONSTITUTING MESH
··· : SKETCH PLANE COORDINATE AXIS

CONFIGURATION OF TRAPEZIUM MESH

CONSTITUENT POINT B1
COORDINATE VALUE
(x1, y1, z1)

CONSTITUENT POINT B4
COORDINATE VALUE
(x4, y4, z4)

CONSTITUENT POINT B3
COORDINATE VALUE
(x3, y3, z3)

CONSTITUENT POINT B2
COORDINATE VALUE
(x2, y2, z2)

EXAMPLE OF SKETCH PLANE

○ GRID COORDINATE
● SPACE COORDINATE CONSTITUTING MESH
⋯ SKETCH PLANE COORDINATE AXIS

EXAMPLE IN WHICH MESH SIZE AND GRID INTERVAL DO NOT COINCIDE WITH EACH OTHER

EXAMPLE IN WHICH MESH SIZE AND GRID INTERVAL COINCIDE WITH EACH OTHER

| P1 | 0.0 | 0.01 | 0.0 |
| P2 | 0.0 | 0.02 | 0.0 |
| P3 | 0.01 | 0.02 | 0.0 |
| P4 | 0.01 | 0.01 | 0.0 |

SUPPORT APPARATUS, DESIGN SUPPORT PROGRAM, AND DESIGN SUPPORT METHOD

CROSS-REFERENCE TO RELATED APPLICATIONS

This application is a continuation application, filed under 35 U.S.C. §111(a), of PCT Application No. PCT/JP2007/063085, filed Jun. 29, 2007, the disclosure of which is herein incorporated in its entirety by reference.

FIELD

The embodiments relates to a design support apparatus, a design support program, and a design support method that support design of an object to be designed by displaying the object to be designed on a virtual space as an object model.

BACKGROUND

The shape of a device such as an electronic device is analyzed after or during design using radio wave that the device transmits. In performing the radio wave analysis, the shape of the device is taken in radio wave analysis software as an object model in which a polygon mesh (hereinafter, referred to merely as "mesh") is set as a basic unit and thereby design of the shape of the device is made on a virtual space formed within a computer.

In the computer's virtual space, a sketch plane is used as a reference plane. FIG. 13 illustrates an example of a sketch plane and an object model. More specifically, FIG. 13 illustrates a cube constituted by six meshes (one plane of the cube corresponds to one mesh) as the object model and a sketch plane represented by points (grid) representing coordinate axes and a grid interval. A user performs design using the sketch plane as a reference plane.

FIG. 14 is a view illustrating an example in which the mesh size and grid interval do not coincide with each other and an example in which the mesh size and grid interval coincide with each other. In particular, in the case where a mesh having the same shape is added, coincidence between the interval of the grid constituting the sketch plane and the length of the side of the mesh allows easy designing. In order to make the grid interval coincide with the length of the mesh side, a user needs to measure the length of the mesh side on the virtual space and manually inputs a result of the measurement in a predetermined grid interval input window.

FIG. 15 illustrates a procedure in which a new mesh is added. A user reads an object model into a virtual space (see "reading of model") and displays a sketch plane (see "display of sketch plane"). The user inputs, using an input device (e.g., mouse), the length of one side of the object model to which a new mesh is added and executes a command to measure the length of the side. After that, the user manually inputs a result of the measurement in a predetermined grid interval input window to make the grid interval coincide with the side of the mesh (see "adjustment of grid interval"). Thereafter, the user manually inputs a numerical value in a predetermined input dialogue such that coordinate axes coincide with the position and direction to and in which the new mesh is added to thereby move or rotate the sketch plane (see "moving or rotation of sketch plane"). After adjusting the sketch plane as described above, the user uses the input device to instruct addition of the new mesh (see "instruction of addition of mesh") to complete the addition of the new mesh (see "completion of addition of mesh").

The details of the mesh will be described here. The mesh is a basic unit of a quadrangle or a triangle forming an object model which is analyzed by an electromagnetic wave analysis software and is defined by four or three points on a three-dimensional world coordinate system (Pw(x,y,z)). Referring to FIG. 16 illustrating an example of an object model constituted by three meshes, a mesh P is defined by four points: P1, P2, P3, and P4, each of which has a value specifying the three-dimensional world coordinate position. Further, the order is defined in each point. For example, P1 is the first, P2 the second, P3 is the third, P4 is the fourth, and P1 comes after P4.

As prior arts relating to the present invention, there are known the following methods: a method that eliminates complication associated with graphic input operation in a graphic display system to improve input efficiency; a method capable of generating three-dimensional shape data of a three-dimensional object in which intention or image of a designer has been reflected; and a method that generates mesh data to be input to a thermo-fluid analysis tool, etc., for an electronic device with ease and high accuracy. Furthermore, there is known an electromagnetic field intensity calculation apparatus with which even beginners can easily create input data at short times so as to effectively perform calculation of an electromagnetic field intensity.

[Patent Document 1] Japanese Laid-open Patent Publication No. 08-16826
[Patent Document 2] Japanese Laid-open Patent Publication No. 2004-206262
[Patent Document 3] Japanese Laid-open Patent Publication No. 2004-94674
[Patent Document 4] Japanese Laid-open Patent Publication No. 11-161690

SUMMARY

According to an aspect of the embodiment, A design support apparatus includes: a reference plane setting section that sets, as a reference plane in a virtual space, the plane of a predetermined mesh which is selected and designated as a first mesh, from among meshes forming the shape of an object model displayed in the virtual space; a reference point setting section that sets a predetermined vertex of the first mesh as a reference point; a coordinate axis setting section that sets a predetermined side of the first mesh that includes the reference point as a first axis and sets a predetermined axis other than the first axis that is included in the reference plane and passes the reference point as a second axis to set the first and second axes as coordinate axes; a coordinate dimension setting section that sets the dimension of each coordinate axis on the basis of the lengths of the sides constituting the first mesh and including the reference point; and a display section that displays, in addition to the object model, the coordinate axes and the dimensions in the virtual space as a coordinate system of the reference plane.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT(S)

Figure 1:
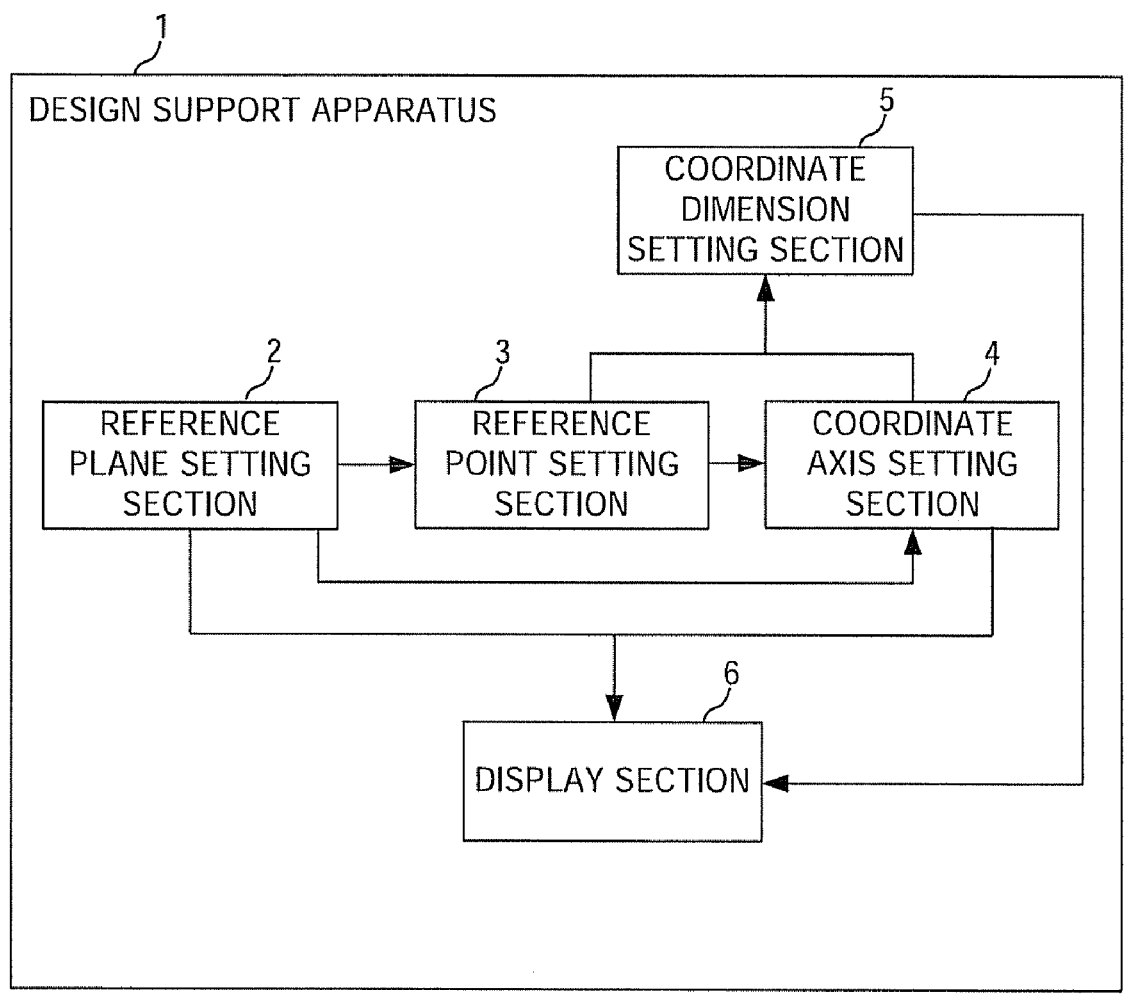
FIG. 1 is a block diagram illustrating an example of a configuration of a design support apparatus according to first and second embodiments.

Embodiments of the present invention will be described below with reference to the accompanying drawings.

In a conventional approach, when adding a new mesh, a user needs to manually input a numerical value in order to set a sketch plane in which the grid interval coincides with the mesh size. In order to input the numerical value, the user needs to previously measure the length of the mesh side or calculate the coordinate position of the mesh. This is considerably troublesome and deteriorates the efficiency of user's design work.

An object of the present embodiment is to provide a design support apparatus, a design support program, and a design support method allowing a user to generate a sketch plane without previously measuring the dimension of the coordinate system on which the sketch plane is generated and the length of the mesh side and without inputting a numerical value of a grid interval.

First Embodiment

First, functional blocks of a design support apparatus according to the first embodiment will be described with reference to a functional block diagram of FIG. 1. A design support apparatus 1 includes a reference plane setting section 2, a reference point setting section 3, a coordinate axis setting section 4, a coordinate dimension setting section 5, and a display section 6. The design support apparatus 1 is a computer provided with hardware resources including at least a CPU (Central processing Unit), a main storage unit, a non-volatile storage unit such as a magnetic storage unit, input devices such as a keyboard, a mouse, and the like, and an output unit such as a monitor. The above functional blocks are achieved through cooperation between the hardware resources and a predetermined program that has previously been installed in the non-volatile storage unit.

When a user selects and designates, among meshes forming the shape of an object model (object to be designed (object) which is displayed in a virtual space on a computer with a polygon mesh as a basic unit), a predetermined mesh (hereinafter, the selected mesh is referred to as "selected mesh (first mesh)"), the reference plane setting section 2 sets the plane of the selected mesh as a sketch plane (reference plane) in the virtual space.

The reference point setting section 3 sets a predetermined vertex of the selected mesh as a reference point.

The coordinate axis setting section 4 sets a predetermined side of the selected mesh that includes the reference point as an x-axis (first axis) and sets a predetermined axis other than the x-axis that is included in the sketch plane and passes the reference point as a y-axis (second axis), thereby setting the coordinate axes. In the first embodiment, the sides other than the side set as the x-axis are set as the y-axes.

The coordinate dimension setting section 5 sets the grid (dimension) of each of the x- and y-axes on the basis of the lengths of the sides constituting the selected mesh and including the reference point.

The display section 6 displays, in addition to the object model, the coordinate axes and the grid in the virtual space as a coordinate system of the reference plane.

In the first embodiment, an electronic device that outputs electromagnetic waves is set as an object to be designed. However, any object may be set as the object to be designed as long as it has a predetermined shape. Further, although the design support apparatus 1 is used for electromagnetic wave analysis, the use application thereof is not limited to this.

Figure 2:
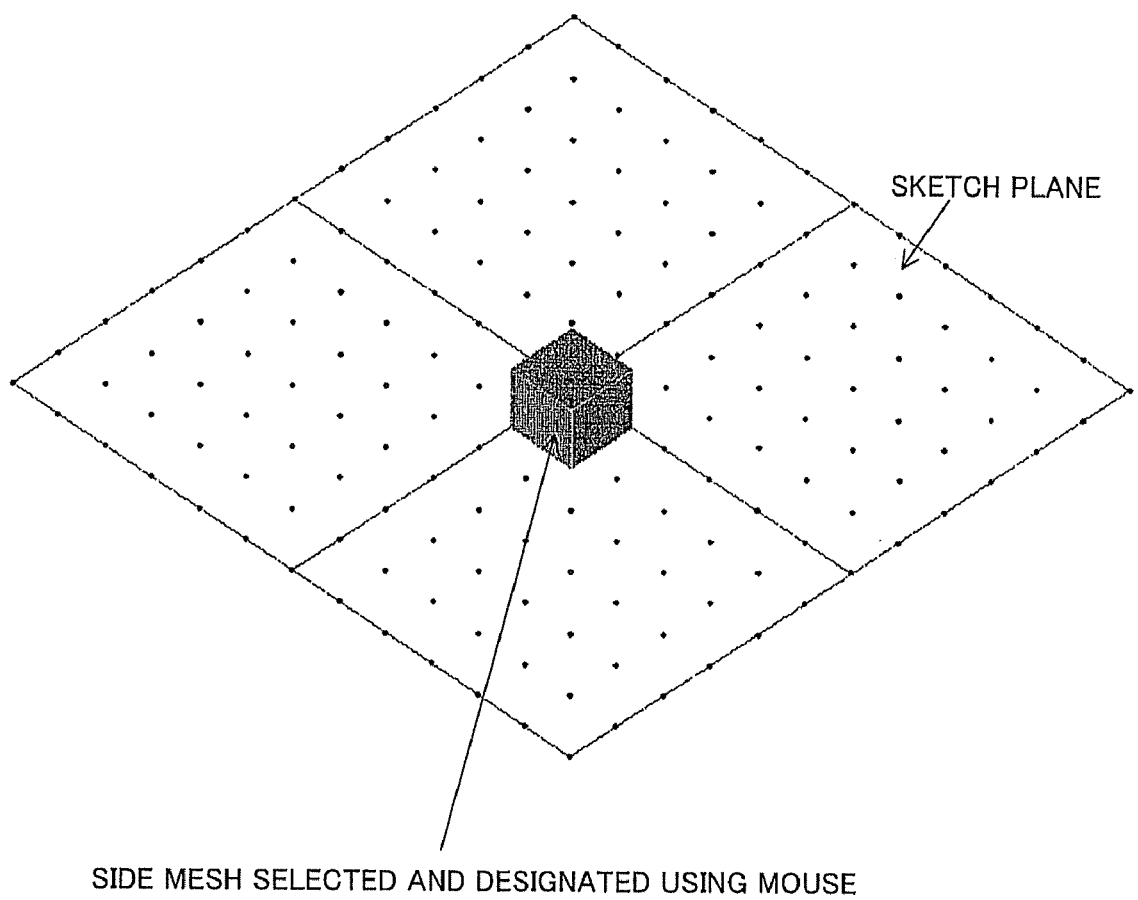
FIG. 2 is a view illustrating an example of a display of an object model and a sketch plane before processing displayed in the design support apparatus according to the first embodiment.
Figure 3:
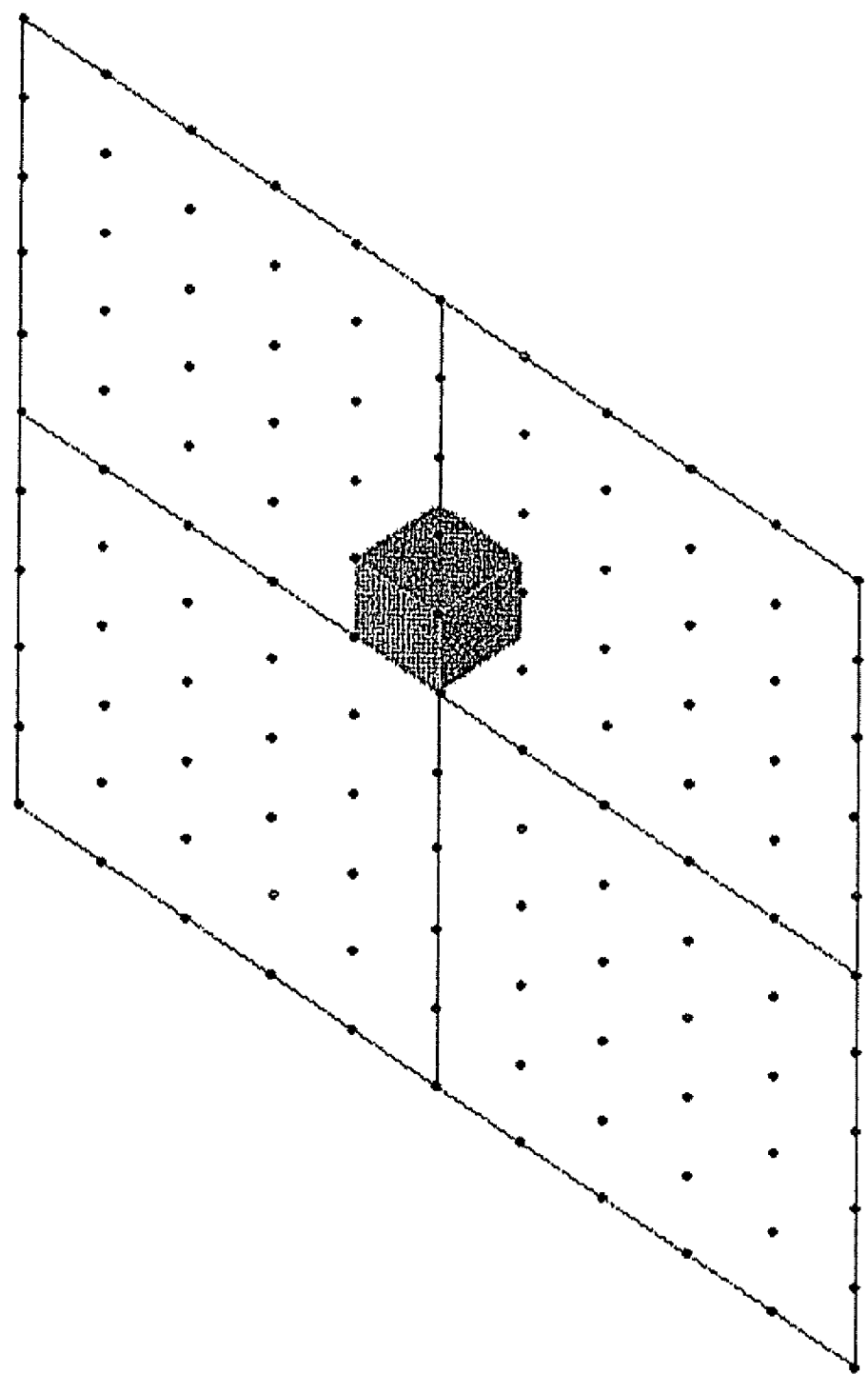
FIG. 3 is a view illustrating an example of a display of an object model and a sketch plane after processing displayed in the design support apparatus according to the first embodiment.

For easy understanding of processing performed in the first embodiment, FIG. 2 illustrates an object model and a sketch plane before processing which are displayed on the display section 6, and FIG. 3 illustrates the object model and sketch plane after processing. The object model used in the first embodiment is assumed to have a cube having six planes (each plane corresponds to one mesh, i.e., the cube is constituted by six square meshes).

In the object model, a mesh pointed by a mouse is set as the selected mesh. FIG. 2 illustrates a case where a mesh corresponding to the front side surface of the object model has been selected and designated by a user using a mouse. Further, as illustrated in FIG. 3, a plane parallel to the pointed mesh is displayed as the sketch plane (reference plane) with a vertex nearest the pointed position in the selected mesh set as the reference point. Further, as illustrated in FIG. 3, the grid interval on the sketch plane is made coincide with the length of the side of the selected mesh.

Figure 4:
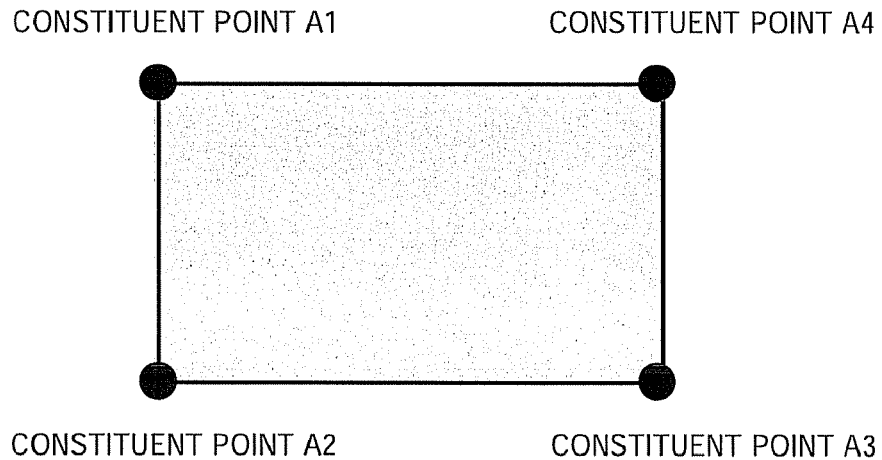
FIG. 4 is a view illustrating an example of processing performed in the design support apparatus according to the first embodiment.
Figure 4:
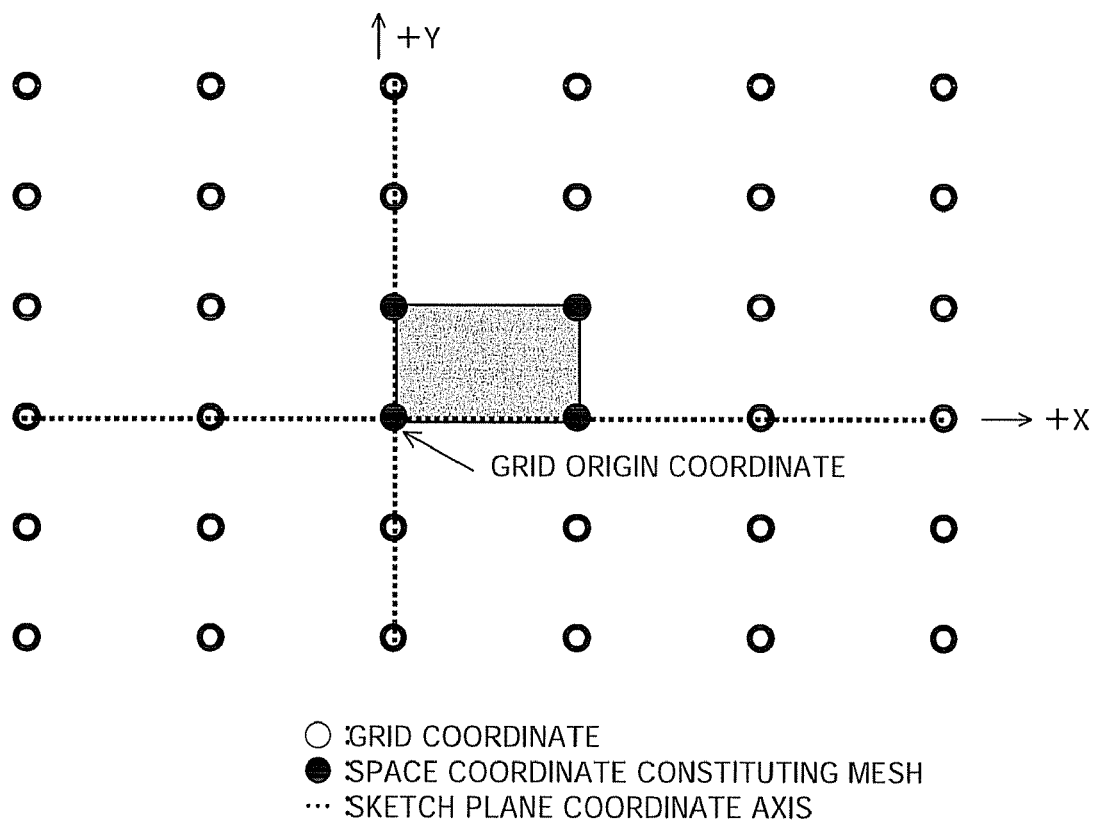

The details of the mesh in the first embodiment will be described with reference to FIG. 4. In this example, a mesh has a quadrangular shape in which the angle between every adjacent two sides is 90°. The quadrangle mesh has four constituent points A1, A2, A3, and A4 which are defined by coordinate values in the three-dimensional world coordinate system (see "configuration of quadrangle mesh" of FIG. 4). Further, the order is defined in each coordinate of the constituent points A1, A2, A3, and A4. For example, A1 is the first, A2 the second, A3 is the third, A4 is the fourth, and A1 comes after A4.

When a user points (selects and designates) a predetermined mesh by using a mouse, the design support apparatus 1 according to the first embodiment determines the pointed mesh as the selected mesh. Further, the design support apparatus 1 measures the lengths of the sides of the selected mesh, sets a result of the measurement as grid intervals, and thereby generates a sketch plane (see "example of sketch plane" of FIG. 4). Further, a vertex (one of the abovementioned constituent points A1, A2, A3, and A4 that is nearest the position pointed by a user) in the selected mesh nearest the position pointed by the mouse is set as the origin coordinate (reference point) of the grid.

Figure 5:
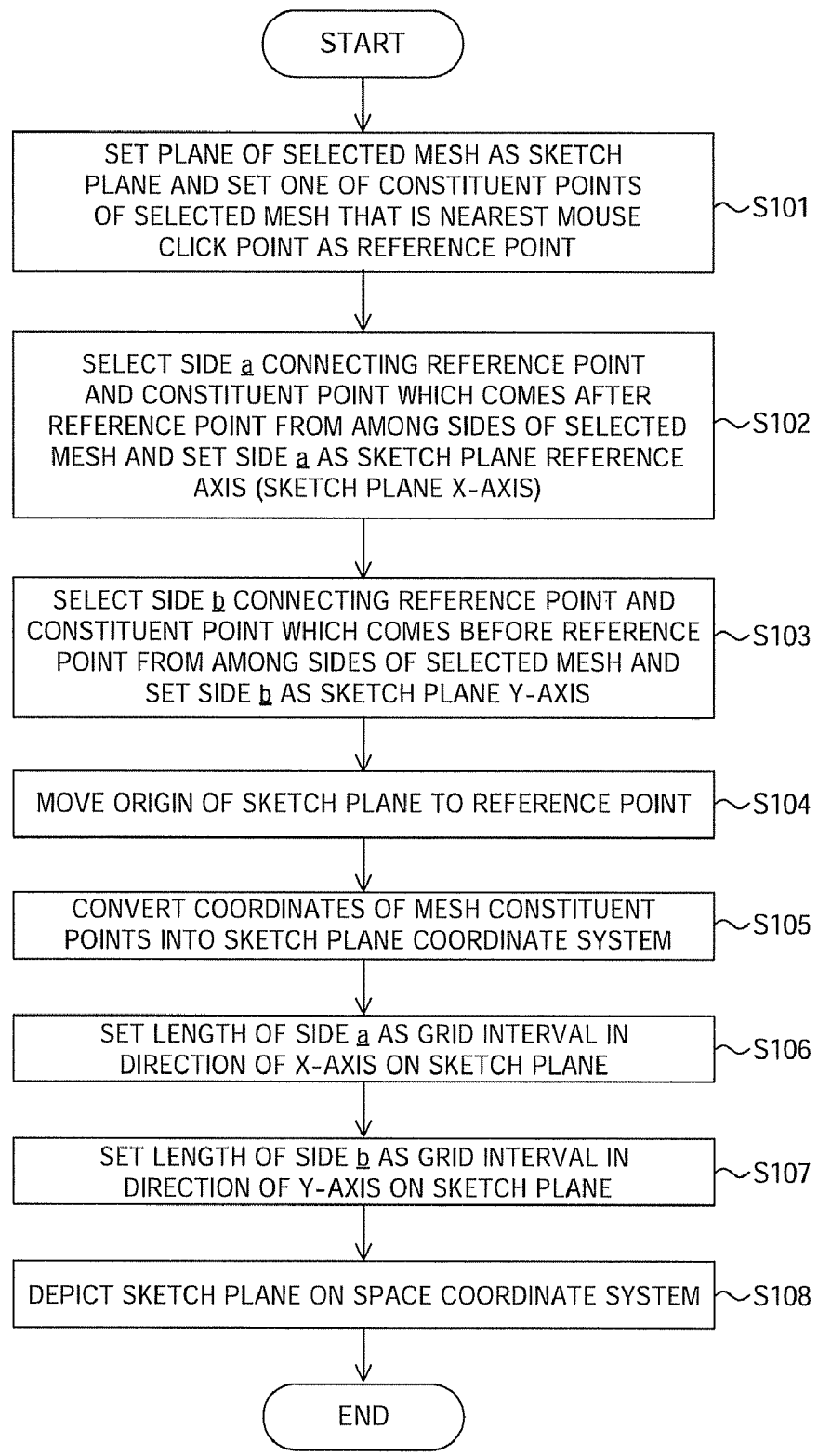
FIG. 5 is a flowchart illustrating an example of processing performed in the design support apparatus according to the first embodiment.

Taking the above into consideration, the processing performed in the design support apparatus 1 according to the first embodiment will be described with reference to a flowchart of FIG. 5.

When a user points a predetermined mesh, the reference plane setting section 2 recognizes the pointed mesh as the selected mesh and sets the plane of the selected mesh as the sketch plane. Then, the reference point setting section 3 sets one of the constituent points (vertexes) that is nearest the mouse click point as the reference point (step S101).

The coordinate axis setting section 4 selects a constituent point which comes after the reference point according to the abovementioned order among the constituent points and sets the side (side a) connecting the reference point and the constituent point coming after the reference point as a reference axis (x-axis of the sketch plane) of the sketch plane (step S102). Further, the coordinate axis setting section 4 selects a constituent point which comes before the reference point according to the abovementioned order among the constituent points and sets the side (side b) connecting the reference point and the constituent point coming before the reference point as a y-axis of the sketch plane (step S103).

The reference point setting section 3 moves the current coordinate of the reference point (origin) of the sketch plane to the coordinate of the reference point set in step S101 (step S104).

The coordinate dimension setting section 5 converts the coordinates of the constituent points constituting the mesh into a sketch plane coordinate system (step S105).

The coordinate dimension setting section 5 then sets the length of the side a as a grid interval in the direction of the x-axis on the sketch plane (step S106) and sets the length of the side b as a grid interval in the direction of the y-axis on the sketch plane (step S107). Since the side a is made coincide with the x-axis and side b is made coincide with the y-axis in the first embodiment, the length of the x-axis component of the side a coincides with the length of the side a, and the length of the y-axis component of the side b coincides with the length of the side b.

Finally, the display section 6 displays a sketch plane represented by the coordinate axes (x-axis and y-axis) set by the coordinate axis setting section 4 and a grid with the grid intervals set by the coordinate dimension setting section 5 (step S108).

Although the angle between every adjacent two sides of the selected mesh is 90° in the first embodiment, it need not be defined in that way. In the case where the two sides of the selected mesh that have been selected as the reference sides do not cross at right angles, the x-axis and y-axis corresponding to the selected reference sides do not cross at right angles, the coordinate system used is not an orthogonal coordinate system.

According to the first embodiment, it is possible to generate the sketch plane without the need for a user to manually input a numerical value as grid intervals of the sketch plane.

Second Embodiment

In the first embodiment, the selected mesh is a square or rectangle mesh in which the angle between every adjacent two sides is 90°, while in the second embodiment, the selected mesh is assumed to be a trapezium mesh in which the angle between every adjacent two sides is not 90°.

The function block of the second embodiment is the same as that of the first embodiment (see FIG. 1). The coordinate axis setting section 4 in the second embodiment sets, as the y-axis, the axis that is included in the reference plane, passes the reference point, and crosses the x-axis at right angles. Further, the coordinate axis setting section 4 has a function of determining which one of the sides of the selected mesh that pass the reference point is set as a reference axis.

Figure 6:
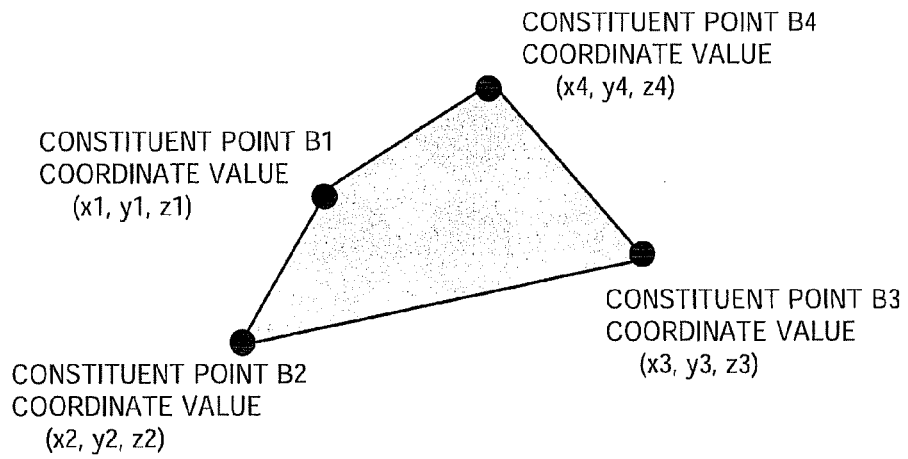
FIG. 6 is a view illustrating an example of processing performed in the design support apparatus according to a second embodiment.
Figure 6:
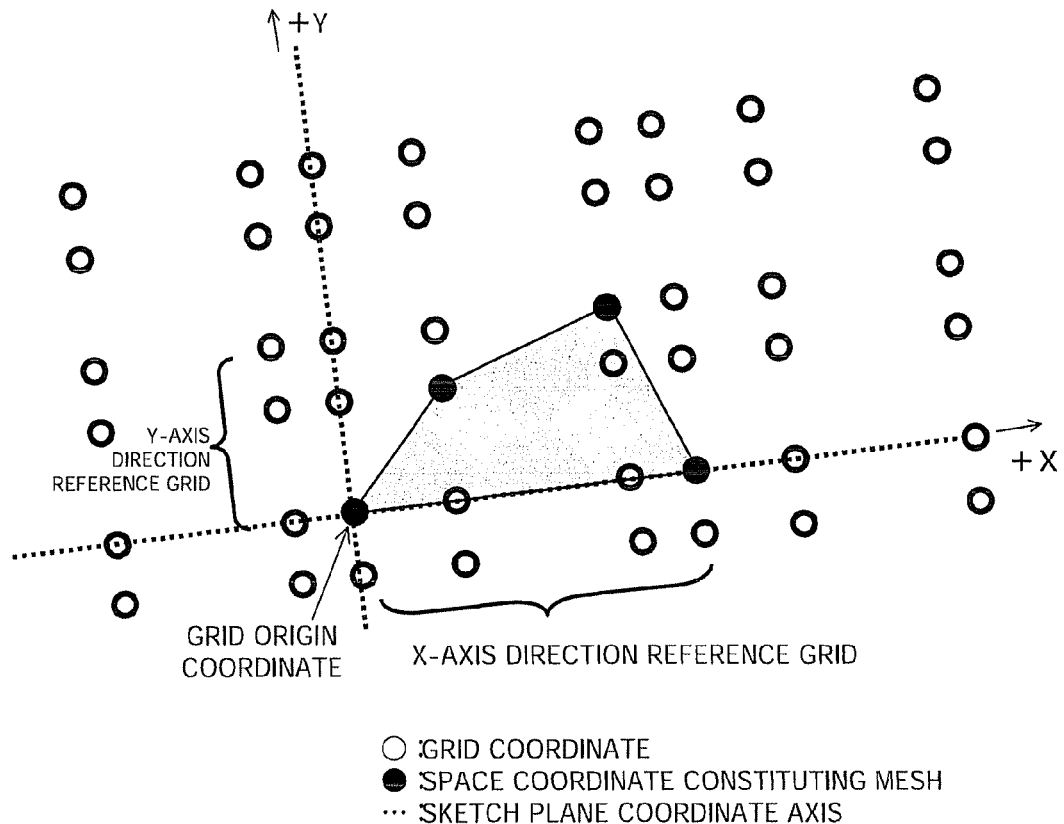

The details of the mesh in the second embodiment will be described with reference to FIG. 6. The trapezium mesh has four constituent points B1, B2, B3, and B4 which are defined by coordinate values in the three-dimensional world coordinate system as in the case of the first embodiment (see "configuration of trapezium mesh"). Further, the order is defined in each coordinate of the constituent points B1, B2, B3, and B4. For example, B1 is the first, B2 the second, B3 is the third, B4 is the fourth, and B1 comes after 84.

The selected mesh and grid interval in the second embodiment will be described with reference to "example of sketch plane" of FIG. 6. When a user points a predetermined mesh by using a mouse, the design support apparatus 1 determines the pointed mesh as the selected mesh. Further, the design support apparatus 1 sets a vertex nearest the position pointed by the mouse as the origin coordinate (reference point) of the grid. Further, the design support apparatus 1 sets a predetermined side that constitutes the selected mesh and passes the reference point as the x-axis (reference axis) and sets the axis that crosses the x-axis at right angles in the sketch plane and passes the reference point as the y-axis. Further, the design support apparatus 1 measures the lengths of the sides of the selected mesh, decomposes the measured lengths into x- and y-axes coordinate components, and sets the decomposed lengths as grid intervals.

A value obtained by subtracting the minimum value of the x-axis component length from the maximum value thereof is set as "x-axis direction reference grid", and a value obtained by subtracting the minimum value of the y-axis component length from the maximum value thereof is set as "y-axis direction reference grid".

Figure 7:
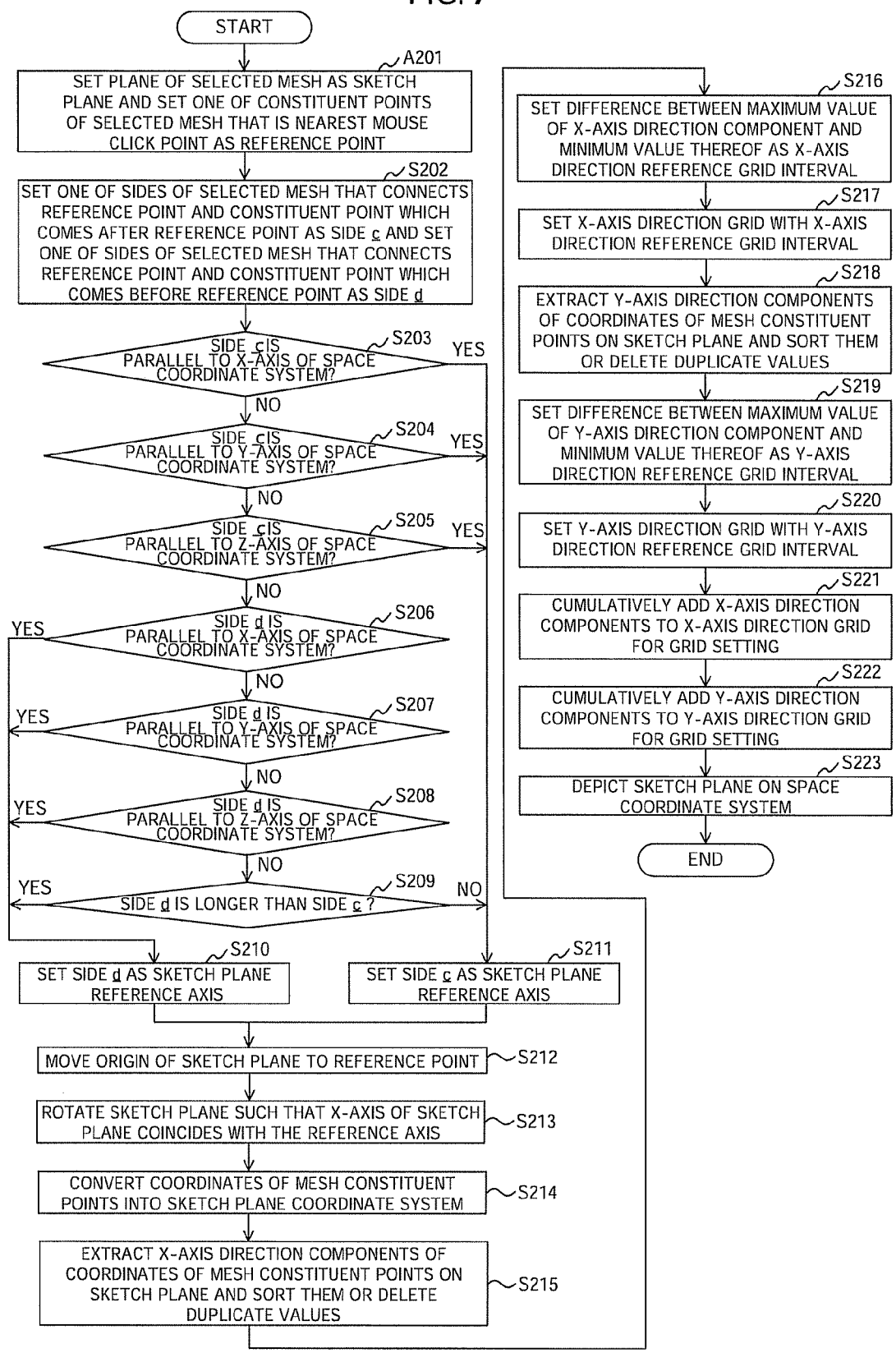
FIG. 7 is a flowchart illustrating an example of processing performed in the design support apparatus according to the second embodiment.

The processing performed in the design support apparatus 1 according to the second embodiment will be described with reference to a flowchart of FIG. 7.

The reference plane setting section 2 recognizes a mesh pointed by a mouse as the selected mesh and sets the plane of the selected mesh as the sketch plane. Then, the reference point setting section 3 sets one of the constituent points (vertexes of the selected mesh) of the selected mesh that is nearest the mouse click point as the reference point (step S201).

The coordinate axis setting section 4 selects a constituent point which comes after the reference point according to the abovementioned order among the constituent points and sets the side connecting the reference point and the constituent point coming after the reference point as side c. Further, the coordinate axis setting section 4 selects a constituent point which comes before the reference point according to the abovementioned order among the constituent points and sets the side connecting the reference point and the constituent point coming before the reference point as side d (step S202).

The coordinate axis setting section 4 determines whether the side c is parallel to any one of x-, y-, and z-axes of the space coordinate system (three-dimensional world coordinate system) (step S203, step S204, and step S205). When determining that the side c is parallel to any one of the axes on the space coordinate system (YES in one of steps S203, S204, and S205), the coordinate axis setting section 4 sets the side c as the reference axis of the sketch plane (step S211). When determining that the side c is not parallel to any one of the axes on the space coordinate system (NO in all steps S203, S204, and S205), the coordinate axis setting section 4 determines whether the side d is parallel to any one of x-, y-, and z-axes of the space coordinate system (step S206, step S207, and step S208).

When determining that the side d is parallel to any one of the axes on the space coordinate system (YES in one of steps S206, S207, and S208), the coordinate axis setting section 4 sets the side d as the reference axis of the sketch plane (step S210). When determining that the side d is not parallel to any one of the axes on the space coordinate system (NO in all steps S206, S207, and S208), the coordinate axis setting section 4 compares the lengths of the sides c and d (step S209).

When determining that the side d is longer than the side c, the coordinate axis setting section 4 sets the side d as the reference axis of the sketch plane (step S210), while when determining that the side d is not longer than the side c, the coordinate axis setting section 4 sets the side c as the reference axis of the sketch plane (step S211).

The reference point setting section 3 moves the current reference point (origin) of the sketch plane to the reference point (step S212), and the reference plane setting section 2 rotates the sketch plane such that the current x-axis of the sketch plane coincides with the reference axis (step S213).

The coordinate dimension setting section 5 converts the coordinates of the constituent points constituting the mesh into a sketch plane coordinate system (step S214).

The coordinate dimension setting section 5 extracts the x-axis direction components of the coordinates of the mesh constituent points on the sketch plane and sorts them or deletes duplicate values (step S215). The coordinate dimension setting section 5 then sets a difference between the maximum value of the x-axis component and minimum value thereof as an x-axis direction reference grid interval (step S216) and sets an x-axis direction grid on the sketch plane with the x-axis direction reference grid interval (step S217).

Similarly, the coordinate dimension setting section 5 extracts the y-axis direction components of the coordinates of the mesh constituent points on the sketch plane and sorts them or deletes duplicate values (step S218). The coordinate dimension setting section 5 then sets a difference between the maximum value of the y-axis direction component and minimum value thereof as a y-axis direction reference grid interval (step S219) and sets a y-axis direction grid on the sketch plane with the y-axis direction reference grid interval (step S220).

Then, the coordinate dimension setting section 5 cumulatively adds the x-axis direction components other than the maximum and minimum values thereof extracted in step S215 and sets a grid in the x-axis direction reference grid (step S221). Similarly, the coordinate dimension setting section 5 cumulatively adds the y-axis direction components other than the maximum and minimum values thereof extracted in step S218 and sets a grid in the y-axis direction reference grid (step S222).

Finally, the display section 6 displays a sketch plane represented by the coordinate axes (x-axis and y-axis) set by the coordinate axis setting section 4 and a grid set by the coordinate dimension setting section 5 (step S223).

Figure 8:
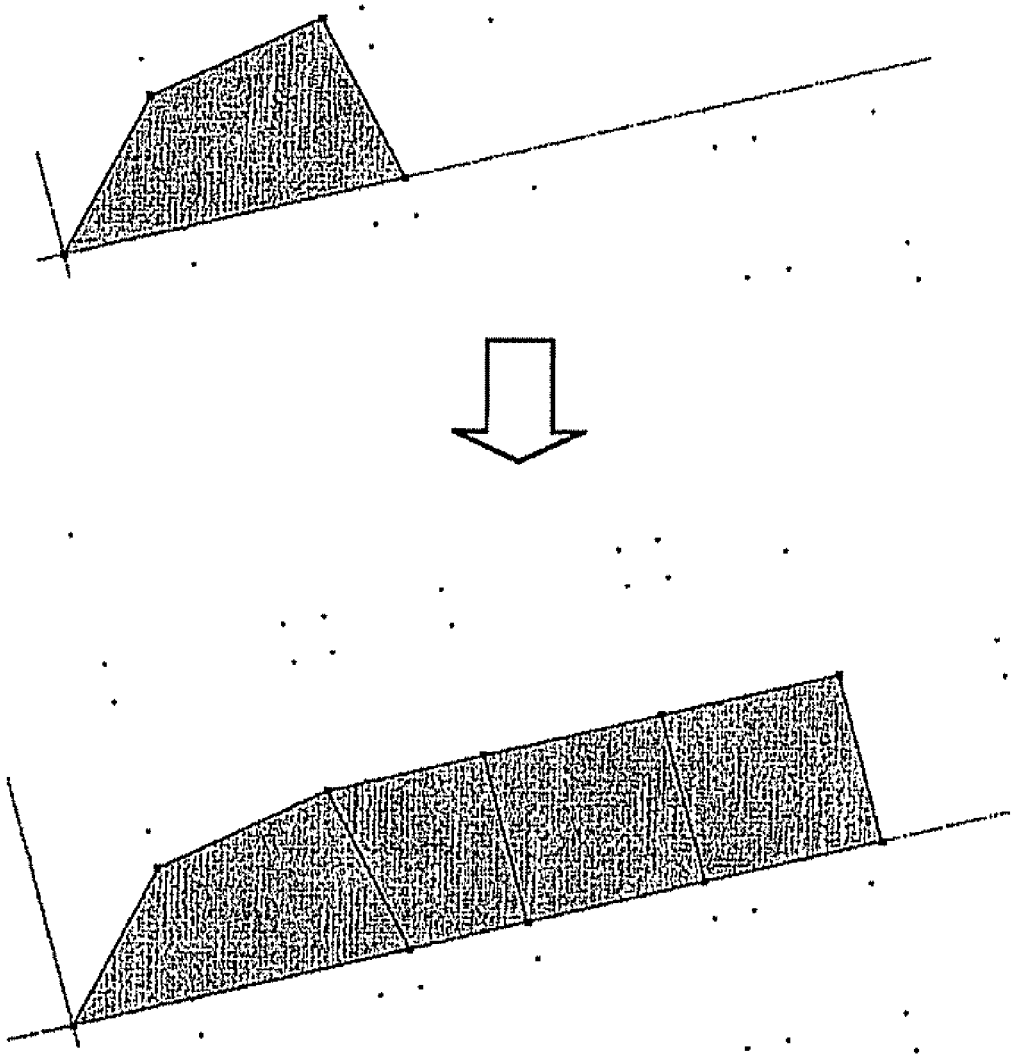
FIG. 8 is a view illustrating an example of processing performed in the design support apparatus according to the second embodiment.

When a new mesh is added, the new mesh is often added in the mesh side direction as illustrated in FIG. 8. The second embodiment allows easy designing in such a case.

Third Embodiment

Figure 9:
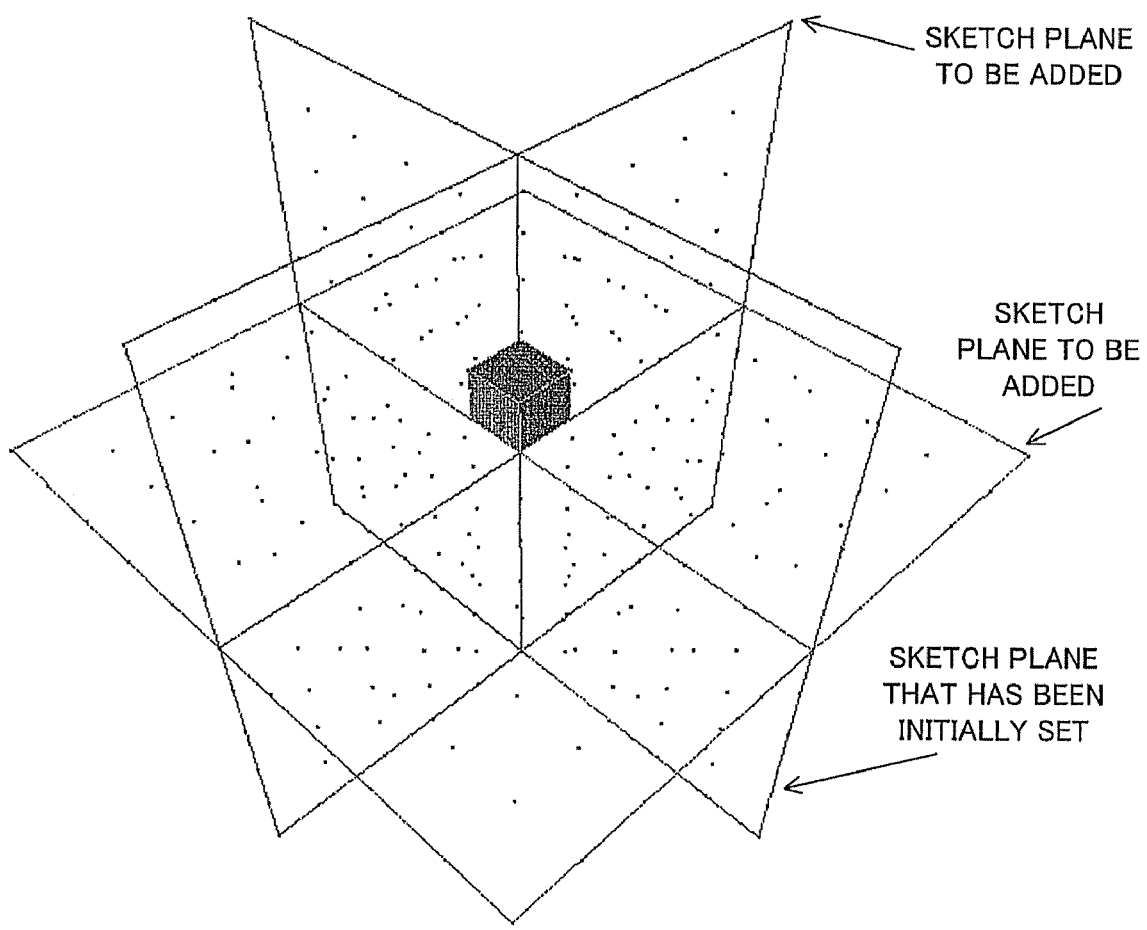
FIG. 9 is a view illustrating an example of a display of a sketch plane and a mesh after processing displayed in the design support apparatus according to a third embodiment.

In the third embodiment, two planes ("sketch planes to be added" in FIG. 9) that cross at right angles the sketch plane ("sketch plane that has been initially set" in FIG. 9) set in the first and second embodiments and include the reference point are displayed.

Figure 10:
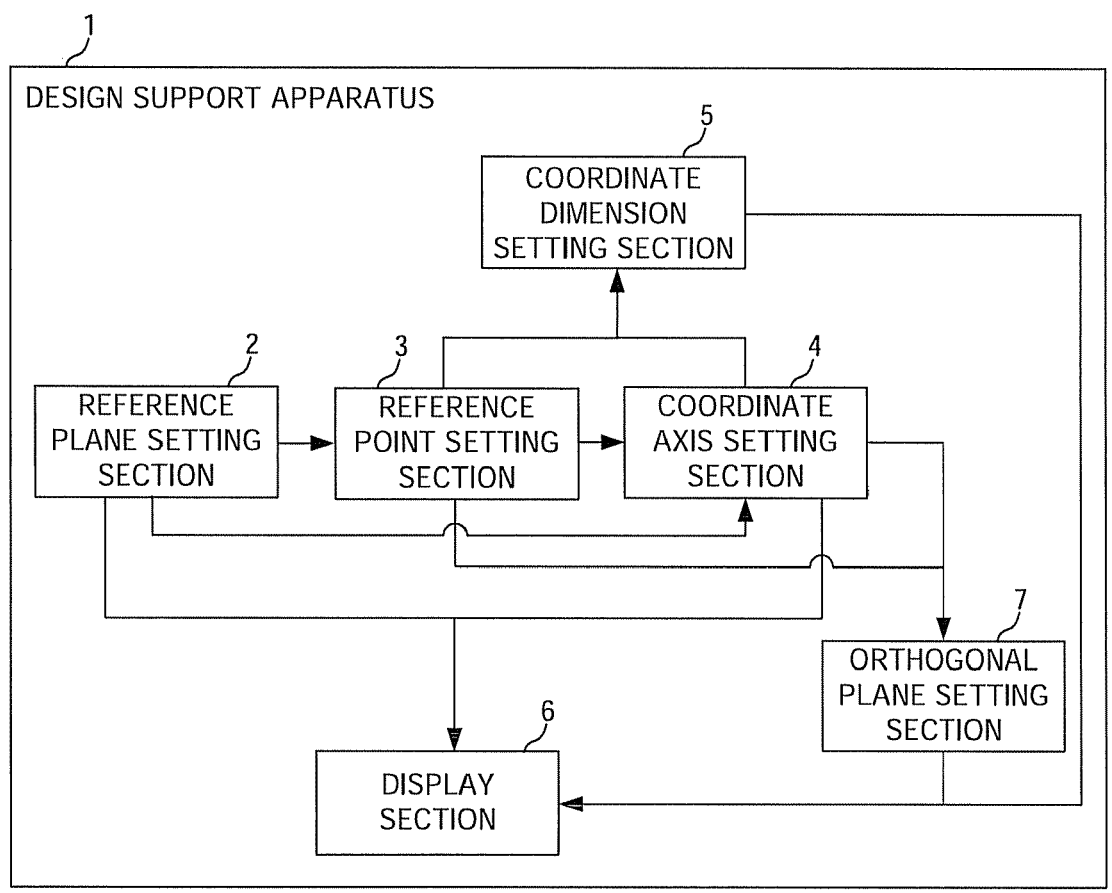
FIG. 10 is a block diagram illustrating an example of a configuration of the design support apparatus according to the third embodiment.

FIG. 10 illustrates a functional block diagram of the third embodiment. The design support apparatus according to the third embodiment differs from that of the first and second embodiments in that it further includes an orthogonal plane setting section 7. The orthogonal plane setting section 7 sets a sketch plane that includes the reference point and crosses the x-axis at right angles and a sketch plane that includes the reference point and crosses the y-axis at right angles. The display section 6 displays the sketch planes set by the orthogonal plane setting section 7. The functional blocks other than the orthogonal plane setting section 7 and display section 6 are the same or substantially the same as those of the first and second embodiments, and the descriptions thereof will be omitted here.

Figure 11:
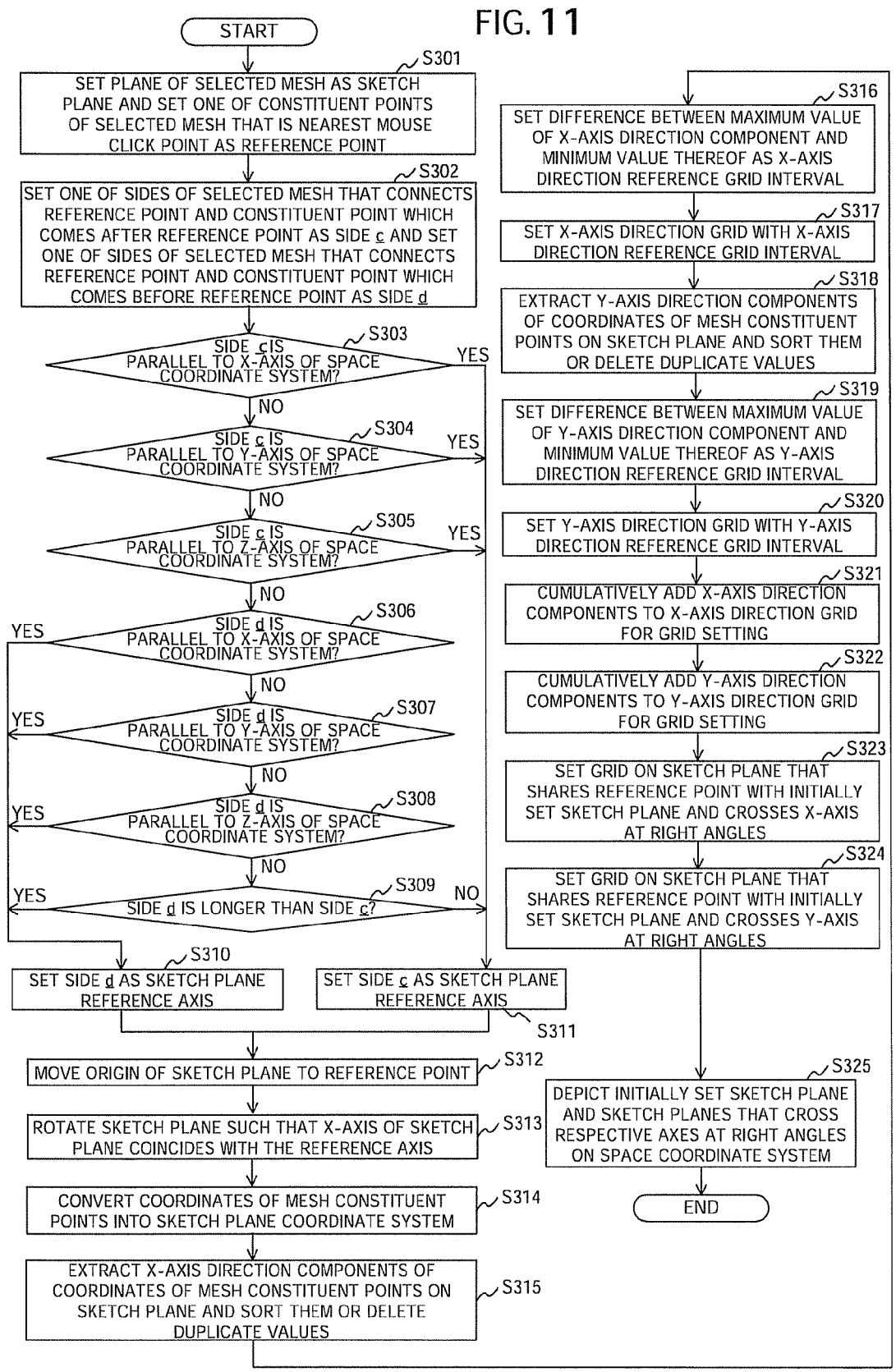
FIG. 11 is a flowchart illustrating an example of processing performed in the design support apparatus according to the third embodiment.

The processing performed in the design support apparatus 1 in the third embodiment will be described with reference to a flowchart of FIG. 11. The processing from step S301 to step S322 is the same as that from step S201 to step S222 in the second embodiment, and the descriptions thereof will be omitted here.

The orthogonal plane setting section 7 sets a sketch plane (first plane) that shares the reference point with the sketch plane that has been initially set in step S301 and crosses the x-axis at right angles, and sets a grid on the set first plane (step S323).

The orthogonal plane setting section 7 sets a sketch plane (second plane) that shares the reference point with the sketch plane that has been initially set in step S301 and crosses the y-axis at right angles and sets a grid on the set second plane (step S324).

The display section 6 displays the initially set sketch plane and two sketch planes set in step S323 and step S324 on a space coordinate system (step S325).

The display section 6 according to the third embodiment displays, at a time, the two sketch planes that cross the respective coordinate axes at right angles together with the sketch plane (reference plane) that has been displayed. Alternatively, however, a step that selects only one sketch plane that crosses one of the two coordinate axes (x-axis or y-axis) at right angles may be provided between steps S322 and S323 for displaying only the selected sketch plane.

Figure 12:
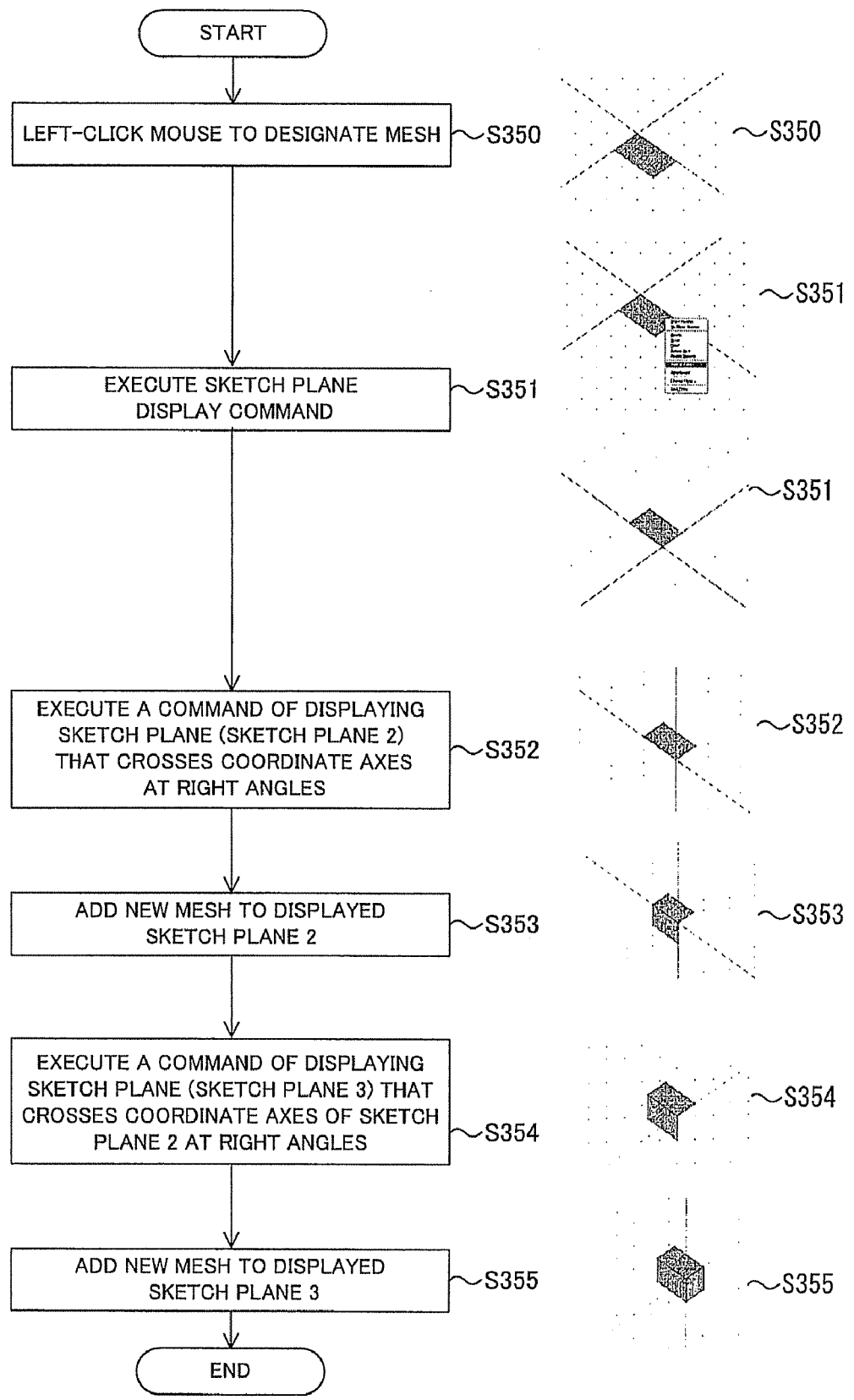
FIG. 12 is a view illustrating an example of a procedure of mesh addition operation of the design support apparatus according to the third embodiment.
Figure 13:
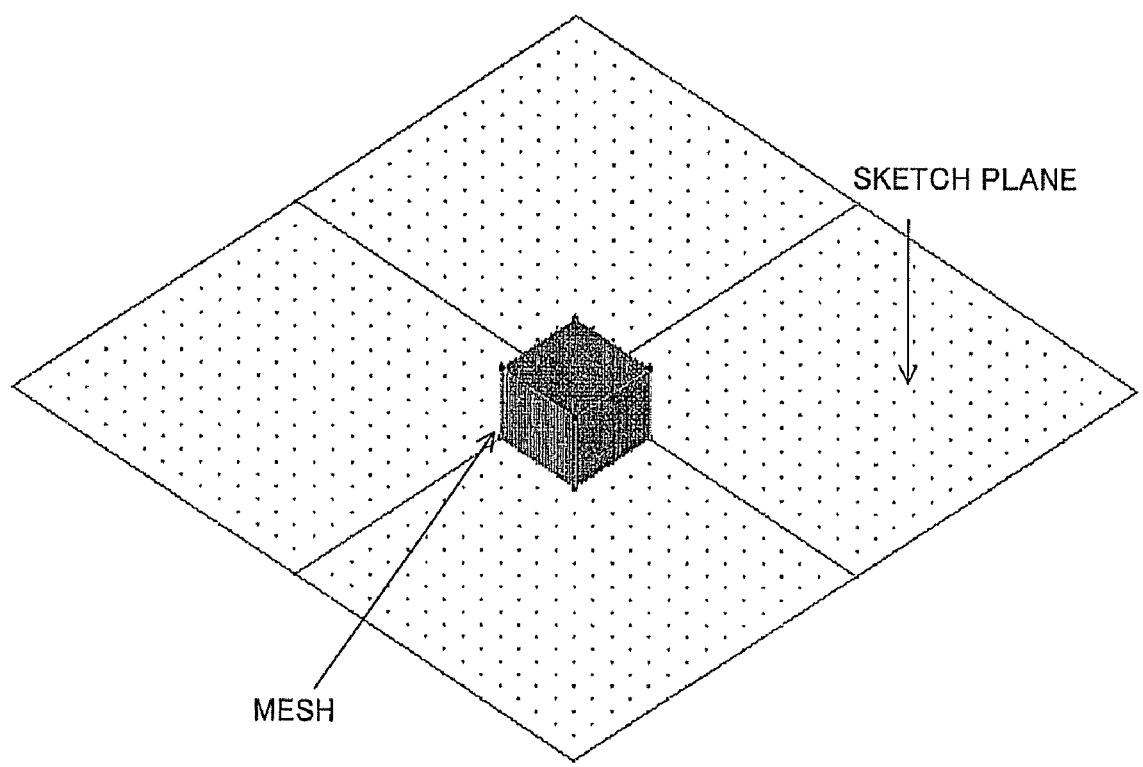
FIG. 13 is a view illustrating an example of the entire display representing a sketch plane and a mesh in a conventional approach.
Figure 14:
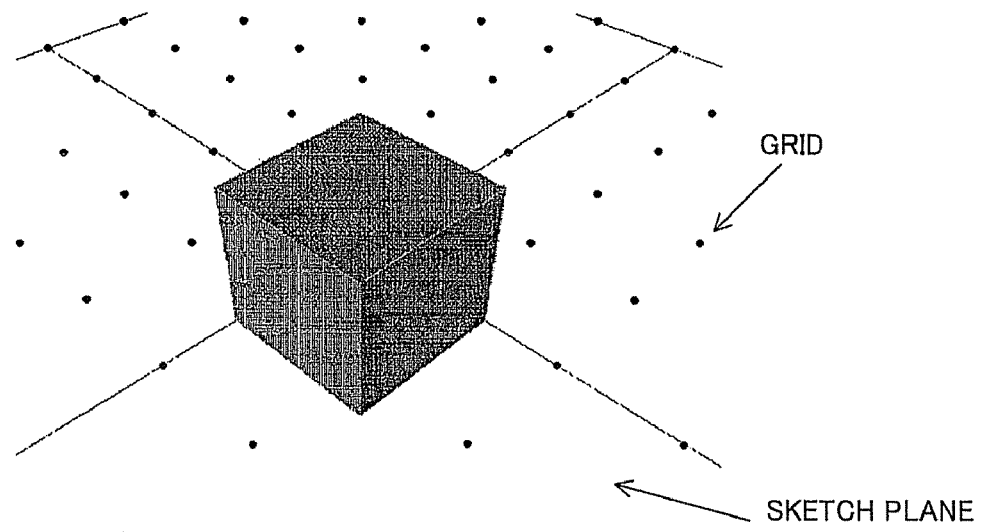
FIG. 14 is a view illustrating a relationship between a mesh and a grid interval in a conventional approach.
Figure 14:
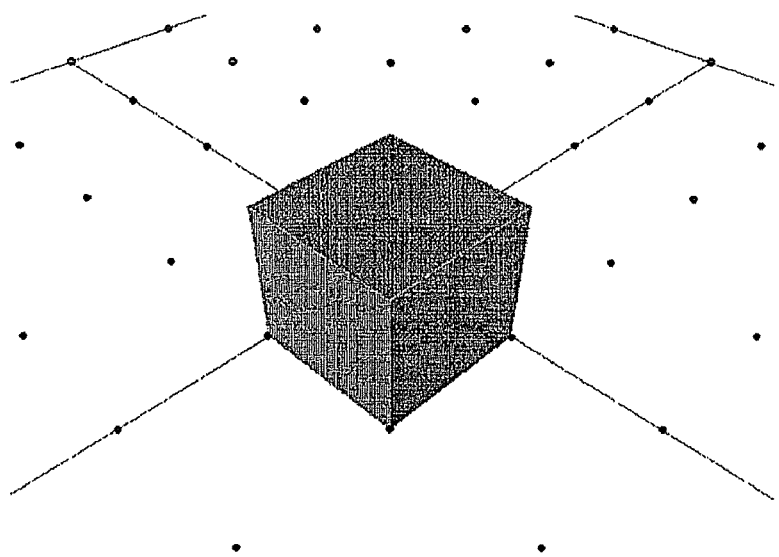
Figure 15:
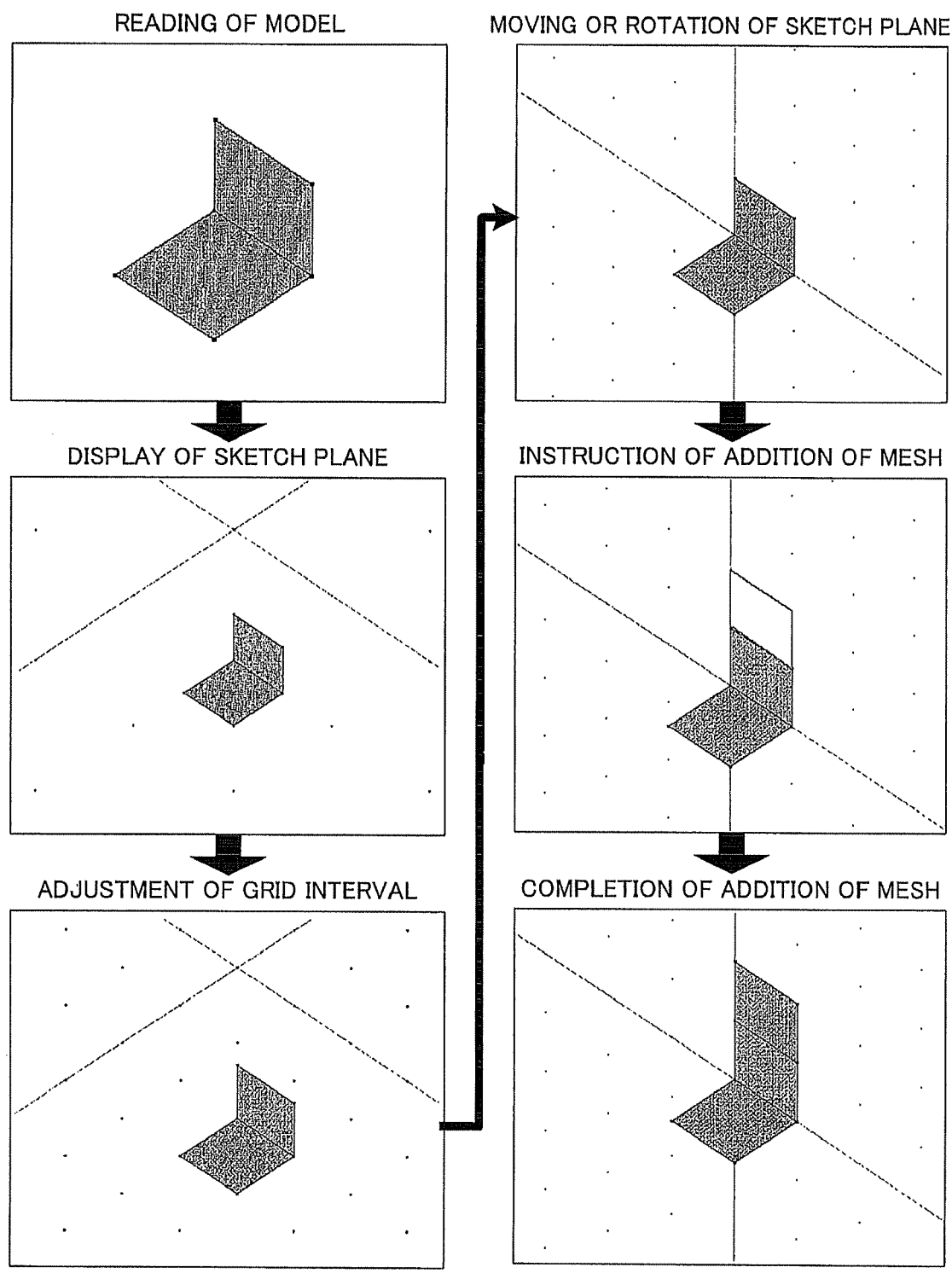
FIG. 15 is a view illustrating a conventional procedure in which a new mesh is added.
Figure 16:
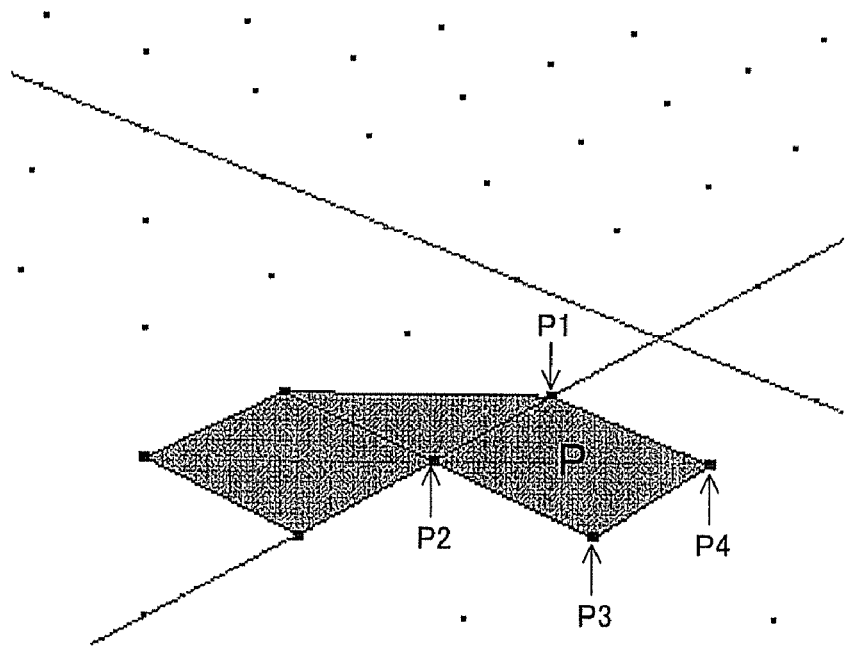
FIG. 16 is a view illustrating an example of meshes in an object model.

FIG. 12 illustrates an example of mesh addition operation performed by a user in the third embodiment. FIG. 12 illustrates user operation in the form of a flowchart, as well as, illustrates corresponding screen transition of the design support apparatus 1 by affixing the corresponding reference symbols.

When a user selects and designates (left-clicks a mouse) a predetermined mesh, a selected mesh is determined (step S350). After that, a sketch plane display command is executed and, thereby, a sketch plane (coordinate axes and grid) is set and displayed (step S351). Then, the user executes a command of displaying a sketch plane that crosses one of the coordinate axes at right angles (step S352) and, thereby, a sketch plane (sketch plane 2) that crosses the existing sketch plane at right angles is displayed. The user adds a new mesh to the sketch plane 2 (step S353). Then, the user executes a command of displaying a sketch plane (sketch plane 3) that crosses the sketch plane 2 at right angles (step S354) and, thereby, a sketch plane (sketch plane 3) that crosses the sketch plane 2 at right angles is displayed. The user adds a new mesh to the sketch plane 3 (step S355). The above procedure is repeated to thereby complete the design of the object model.

Further, it is possible to provide a program that allows a computer constituting the design support apparatus to execute the above steps as a design support program. By storing the above program in a computer-readable recording medium, it is possible to allow the computer constituting the design support apparatus to execute the program. The computer-readable recording medium mentioned here includes: an internal storage device mounted in a computer, such as ROM or RAM, a portable storage medium such as a CD-ROM, a flexible disk, a DVD disk, a magneto-optical disk, or an IC card; a database that holds computer program; another computer and database thereof; and a transmission medium on a network line.

As described above, by setting the reference plane, coordinate axes, and dimension based on the selected mesh, it is possible to improve efficiency of design of an object.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A design support apparatus comprising:
   at least one processing unit providing:
      a reference plane setting section that sets, as a reference plane in a virtual space, the plane of a predetermined mesh which is selected and designated as a first mesh, from among meshes forming the shape of an object model displayed in the virtual space;
      a reference point setting section that sets a predetermined vertex of the first mesh as a reference point;
      a coordinate axis setting section that sets a predetermined side of the first mesh that includes the reference point as a first axis and sets a predetermined axis other than the first axis that is included in the reference plane and passes the reference point as a second axis to set the first and second axes as coordinate axes;
      a coordinate dimension setting section that sets the dimension of each coordinate axis on the basis of the lengths of the sides constituting the first mesh and including the reference point; and
      a display section that displays, in addition to the object model, the coordinate axes and the dimensions in the virtual space as a coordinate system of the reference plane.

2. The design support apparatus according to claim 1, wherein
   the coordinate axis setting section sets, as the second axis, a side other than the side of the first mesh set as the first axis that includes the reference point so as to set the coordinate axes.

3. The design support apparatus according to claim 1, wherein
   the coordinate axis setting section sets, as the second axis, an axis that is included in the reference plane, passes the reference point, and crosses the first axis at right angles so as to set the coordinate axes.

4. The design support apparatus according to claim 1, wherein
   the coordinate axis setting section sets, as the first axis, a side having the longest length among the sides of the first mesh that include the reference point.

5. The design support apparatus according to claim 1, wherein
   the coordinate dimension setting section sets the dimensions of the respective coordinate axes based on the lengths obtained by decomposing the lengths of the sides forming the first mesh into coordinate components of the coordinate axes.

6. The design support apparatus according to claim 1, wherein
   when a predetermined point in the object model is selected and designated, the reference plane setting section sets a mesh including the predetermined point as the first mesh, and
   the reference point setting section sets a vertex of the first mesh that is nearest the predetermined point as the reference point.

7. The design support apparatus according to claim 1, further comprising an orthogonal plane setting section that sets a first plane that includes the reference point and crosses the first axis at right angles and a second plane that includes the reference point and crosses the second axis at right angles, wherein
   the display section further displays the first and second planes.

8. The design support apparatus according to claim 1, wherein
   the mesh is a triangle or quadrangular.

9. The design support apparatus according to claim 1, wherein
   the object is an electronic device that outputs electromagnetic waves.

10. A computer-readable non-transitory recording medium that stores a design support program allowing a computer to execute a process, the process comprising:
    setting, as a reference plane in a virtual space, the plane of a predetermined mesh which is selected and designated as a first mesh, from among meshes forming the shape of an object model displayed in the virtual space;
    setting a predetermined vertex of the first mesh as a reference point;
    setting a predetermined side of the first mesh that includes the reference point as a first axis and setting a predetermined axis other than the first axis that is included in the reference plane and passes the reference point as a second axis to set the first and second axes as coordinate axes;
    setting the dimension of each coordinate axis on the basis of the lengths of the sides constituting the first mesh and including the reference point; and displaying, in addition to the object model, the coordinate axes and the dimensions in the virtual space as a coordinate system of the reference plane.

11. The computer-readable non-transitory recording medium according to claim 10, wherein
the setting of coordinate axes sets, as the second axis, a side other than the side of the first mesh set as the first axis that includes the reference point so as to set the coordinate axes.

12. The computer-readable non-transitory recording medium according to claim 10, wherein
the setting of coordinate axes sets, as the second axis, an axis that is included in the reference plane, passes the reference point, and crosses the first axis at right angles so as to set the coordinate axes.

13. The computer-readable non-transitory recording medium according to claim 10, wherein
the setting of coordinate axes sets, as the first axis, a side having the longest length among the sides of the first mesh that include the reference point.

14. The computer-readable non-transitory recording medium according to claim 10, wherein
the setting of coordinate dimensions sets the dimensions of the respective coordinate axes based on the lengths obtained by decomposing the lengths of the sides forming the first mesh into coordinate components of the coordinate axes.

15. The computer-readable non-transitory recording medium according to claim 10, wherein
when a predetermined point in the object model is selected and designated, the setting of reference plane sets a mesh including the predetermined point as the first mesh, and
the setting of reference point sets a vertex of the first mesh that is nearest the predetermined point as the reference point.

16. The computer-readable non-transitory recording medium according to claim 10, the process further sets a first plane that includes the reference point and crosses the first axis at right angles and a second plane that includes the reference point and crosses the second axis at right angles, wherein
the displaying further displays the first and second planes.

17. A design support method performed by a computer comprising:
setting, as a reference plane in a virtual space, the plane of a predetermined mesh which is selected and designated as a first mesh, from among meshes forming the shape of an object model displayed in the virtual space;
setting a predetermined vertex of the first mesh as a reference point;
setting a predetermined side of the first mesh that includes the reference point as a first axis and sets a predetermined axis other than the first axis that is included in the reference plane and passes the reference point as a second axis to set the first and second axes as coordinate axes;
setting the dimension of each coordinate axis on the basis of the lengths of the sides constituting the first mesh and including the reference point; and
displaying, in addition to the object model, the coordinate axes and the dimensions in the virtual space as a coordinate system of the reference plane.

18. The design support method according to claim 17, wherein
the setting of coordinate axes sets, as the second axis, a side other than the side of the first mesh set as the first axis that includes the reference point so as to set the coordinate axes.

19. The design support method according to claim 17, wherein
the setting of coordinate axes sets, as the second axis, an axis that is included in the reference plane, passes the reference point, and crosses the first axis at right angles so as to set the coordinate axes.

20. The design support method according to claim 17, further comprising setting a first plane that includes the reference point and crosses the first axis at right angles and a second plane that includes the reference point and crosses the second axis at right angles, wherein
the displaying further displays the first and second planes.

* * * * *

UNITED STATES PATENT AND TRADEMARK OFFICE
CERTIFICATE OF CORRECTION

PATENT NO.       : 7,952,578 B2  
APPLICATION NO.  : 12/641902  
DATED            : May 31, 2011  
INVENTOR(S)      : Yoshihiro Sawada Page 1 of 1

It is certified that error appears in the above-identified patent and that said Letters Patent is hereby corrected as shown below:

Title Page, item 54 & Column 1, in the title before "SUPPORT" insert -- DESIGN --.

Signed and Sealed this  
Thirtieth Day of August, 2011

David J. Kappos  
*Director of the United States Patent and Trademark Office*